(12) United States Patent
Nakanishi

(10) Patent No.: US 8,882,437 B2
(45) Date of Patent: Nov. 11, 2014

(54) TRANSFER DEVICE, AND WORKPIECE MOUNTING DEVICE

(75) Inventor: Hideaki Nakanishi, Kyoto (JP)

(73) Assignee: Murata Machinery, Ltd., Kyoto-shi (JP)

( * ) Notice: Subject to any disclaimer, the term of this patent is extended or adjusted under 35 U.S.C. 154(b) by 27 days.

(21) Appl. No.: 13/580,663

(22) PCT Filed: Oct. 26, 2010

(86) PCT No.: PCT/JP2010/006307
§ 371 (c)(1),
(2), (4) Date: Aug. 22, 2012

(87) PCT Pub. No.: WO2011/104790
PCT Pub. Date: Sep. 1, 2011

(65) Prior Publication Data
US 2012/0313388 A1 Dec. 13, 2012

(30) Foreign Application Priority Data

Feb. 23, 2010 (JP) ................................. 2010-037904

(51) Int. Cl.
*B66C 1/00* (2006.01)
*B66C 3/00* (2006.01)
*B65G 49/06* (2006.01)
*H01L 21/683* (2006.01)
*H01L 21/687* (2006.01)

(52) U.S. Cl.
CPC ...... *H01L 21/6838* (2013.01); *B65G 2249/045* (2013.01); *B65G 49/061* (2013.01); *H01L 21/68707* (2013.01); *B65G 2249/02* (2013.01); *Y10S 294/902* (2013.01)
USPC .......................... 414/735; 74/490.01; 294/902

(58) Field of Classification Search
USPC .......... 74/490.01–490.06; 414/735, 917, 729;
901/2, 15, 27–29; 403/192, 202–206;
700/258, 245, 255, 250; 294/185, 902,
294/907; 318/568.21, 567; 267/69–74
See application file for complete search history.

(56) References Cited

U.S. PATENT DOCUMENTS 5,715,729 A * 2/1998 Toyama et al. ............ 74/490.03
6,152,507 A 11/2000 Pirker
(Continued)

FOREIGN PATENT DOCUMENTS

JP 08-203983 A 8/1996
JP 078988/1992 1/1997
(Continued)

OTHER PUBLICATIONS

The International Preliminary Report of PCT/JP2010/006307, filed on Oct. 26, 2010 (Japanese and English translation).
(Continued)

*Primary Examiner* — Stephen Vu
(74) *Attorney, Agent, or Firm* — Adli Law Group P.C.

(57) ABSTRACT

A non-contact holding device (1) attached to a parallel mechanism robot (100) has a square plate-like base member (10), a Bernoulli chuck (20) attached to the center on a rear surface of the base member (10), and eight pin-like guide members (30) that are disposed facing each other with the Bernoulli chuck (20) therebetween and that are provided on the rear surface of the base member (10) in a protruding manner. The guide members (30) facing each other are configured to be able to move away from each other. These guide members (30) move away from each other along inner surfaces of guide holes (72) of a workpiece mounting tray (70, 71) as the Bernoulli chuck (20) approaches a workpiece mounting surface (75) of the workpiece mounting tray (70, 71).

19 Claims, 12 Drawing Sheets

(56) References Cited

U.S. PATENT DOCUMENTS

| | | |
|---|---|---|
| 6,516,681 B1 * | 2/2003 | Pierrot et al. ............... 74/490.01 |
| 6,543,987 B2 * | 4/2003 | Ehrat ............................ 414/735 |
| 2003/0033728 A1 | 2/2003 | Iwasaka et al. |
| 2006/0182602 A1 * | 8/2006 | Schuler et al. ................ 414/735 |

FOREIGN PATENT DOCUMENTS

| | | |
|---|---|---|
| JP | 11-265926 A | 9/1999 |
| JP | 2002-011681 A | 1/2002 |
| JP | 2002-239965 A | 8/2002 |
| JP | 2004-083180 | 3/2004 |
| JP | 2005-051260 A | 2/2005 |
| JP | 2006-032687 | 2/2006 |
| JP | 2006-032687 A | 2/2006 |

OTHER PUBLICATIONS

International Search Report based off PCT/JP2010/006307 filed Oct. 26, 2010.

* cited by examiner

TRANSFER DEVICE, AND WORKPIECE MOUNTING DEVICE

CROSS REFERENCE

The present application is a national phase of PCT/JP2010/006307, filed on Oct. 26, 2010, which claims priority from Japanese application JP2010-037904, filed on Feb. 23, 2010, the content of which is incorporated herein by reference in its entirety.

TECHNICAL FIELD

The present invention relates to a transfer device for transferring a workpiece, and a workpiece mounting device used along with the transfer device.

BACKGROUND ART

In recent years, in order to transfer (picking and placing) a relatively thin workpiece such as a solar cell wafer or a lithium ion battery electrode, a transfer device that uses a non-contact holding device capable of holding a workpiece without directly contacting the workpiece has been used. As such a transfer device using a non-contact holding device, Patent Literature 1 (Japanese Patent Application Publication No. 2004-83180) discloses a transporting device (a transfer device) that uses a Bernoulli chuck to generate suction force by ejecting high-pressure air.

The transfer device disclosed in Patent Literature 1 removes a sheet-form board (workpiece) from a stage in the form of a flat plate and transfers the sheet-form board. The transfer device has a Bernoulli chuck functioning as suction means, and a control guide that is positioned so as to abut with an end part of the workpiece disposed on the flat stage and controls the position of the workpiece. This control guide includes a controller provided, with an inclined surface, wherein the end part of the workpiece is brought into abutment with the inclined surface of the controller, thereby preventing Bernoulli chuck and the sheet-form workpiece from coming into contact with each other when the workpiece is suctioned by the Bernoulli chuck. The control guide further restricts a planar movement of the workpiece by means of the inclined surface of the controller when the workpiece is transported while being suctioned.

Incidentally, a solar cell wafer or a lithium ion battery electrode is thin in thickness and fragile as a workpiece. However, the transfer device disclosed in Patent Literature 1 brings the end part of the sheet-form workpiece into abutment with the inclined surface of the controller as described above, to prevent the Bernoulli chuck and the sheet-form board from coming into contact with each other when the Bernoulli chuck suctions the sheet-form board. Therefore, there is a possibility that the sheet-form workpiece cracks or is damaged in different manners when the workpiece is removed from the flat stage.

In addition, if the sheet-form workpiece shifts relative to the positions of the Bernoulli chuck and the control guide when being removed from the flat stage in this transfer device disclosed, in Patent Literature 1, the inclined surface formed in the controller might rub a rim part of the workpiece. Rubbing and consequently damaging the rim part of the workpiece when removing and holding the workpiece (picking up) or mounting the workpiece (placing) results in deterioration of the performance of the solar cell wafer, which is the workpiece.

SUMMARY OF INVENTION

The present invention was contrived in order to solve the problems described above, and an object thereof is to provide a transfer device, capable of preventing a guide member from coming into contact with a rim part of a workpiece, the guide member preventing the workpiece from shifting laterally, when removing the workpiece from a workpiece mounting device and holding it and when mounting the held workpiece on the workpiece mounting device. The present invention also provides the workpiece mounting device used along with the transfer device.

A transfer device according to the present invention has: a non-contact holding unit that holds a workpiece in a non-contact manner; a base member to which the non-contact holding unit is attached; a plurality of guide members that are disposed at intervals so as to surround the workpiece when the workpiece is conveyed and that are provided on the base member in a protruding manner; and a moving mechanism that moves the base member within a space, wherein the plurality of guide members are configured such that at least parts of the plurality of guide members can move away from each other, and wherein, when the workpiece is removed from a workpiece mounting device on which the workpiece is mounted or when the workpiece held by the on-contact holding unit is mounted on the workpiece mounting device, at least parts of the plurality of guide members move away from each other along a guide part formed in the workpiece mounting device, as the non-contact holding unit approaches a workpiece mounting surface of the workpiece mounting device.

According to the transfer device of the present invention, the plurality of guide members disposed around the non-contact holding unit move away from each other along the guide part formed in the workpiece mounting device, as the non-contact holding unit approaches the workpiece mounting surface of the workpiece mounting device on which the workpiece is already mounted or about to be mounted. Therefore, the plurality of guide members are spread to the outside of a rim part of the workpiece when the workpiece is removed or mounted. As a result, the guide members can be prevented from coming into contact with the rim part of the workpiece, when the workpiece is removed from or mounted on the workpiece mounting device.

In the transfer device according to the present invention, it is preferred that the plurality of guide members be disposed facing each other with the non-contact holding unit therebetween. By disposing the plurality of guide members in this fashion, the workpiece held by the non-contact holding unit can be effectively prevented from shifting laterally when being conveyed.

It is preferred that the transfer device according to the present invention have a biasing member that applies biasing force to each of the guide members so as to bring the plurality of guide members close to each other as the plurality of guide members separate from each other, and that the plurality of guide members be moved towards each other by the biasing force of the biasing member, along the guide part formed on the workpiece mounting device, as the non-contact holding unit separates from the workpiece mounting surface of the workpiece mounting device.

In this case, as the non-contact holding unit separates from the workpiece mounting surface of the workpiece mounting device, the plurality of guide members that are spread when the workpiece is removed, are moved towards each other by the biasing force of the biasing member so as to, for example, roughly abut with the rim part of the workpiece. This can appropriately prevent the held workpiece from moving laterally when being conveyed.

In the transfer device according to the present invention, it is preferred that each of the guide members includes a tubular base end part and a conic tip end part extending from the base end part. With this configuration, the area of contact between the rim part of the workpiece and the each guide member can be reduced when conveying the workpiece. Also, the guide members can be moved more smoothly when being guided to the guide part formed in the workpiece mounting device.

In the transfer device according to the present invention, it is preferred that the biasing member be a torsion spring. In this case, the biasing force can be applied to each of the guide members by using spring force of the torsion spring, so as to move the plurality of guide members towards each other as the guide members separate from each other. The use of the torsion spring enables reduction of the size and weight of the movable mechanism.

In the transfer device according to the present invention, it is preferred that each of the guide members be formed from an elastic body. The elasticity of the elastic member can allow each of guide members to spread to the outside of the rim part of the workpiece when the workpiece is removed from or mounted on the workpiece mounting device. Moreover, restoring force of the elastic body can be used to apply each of the guide members with the biasing force that forces the plurality of guide members to move towards each other as the plurality of guide members deform to separate from each other.

Here, it is preferred that each of the guide members be a plate-like member that has a constant width in a direction along an outer rim of the workpiece held by the non-contact holding device. Consequently, the guide members can be deformed and spread easily. Also, a lateral movement of the workpiece can be stably restricted when conveying the workpiece.

In the transfer device according to the present invention, it is preferred that a Bernoulli chuck be used as the non-contact holding unit. In this case, high-pressure air that is ejected from the Bernoulli chuck is discharged from a gap between the Bernoulli chuck and the workpiece, generating a Bernoulli effect. As a result, suction force is generated. With the suction force, the workpiece can be held in a non-contact manner.

In the transfer device according to the present invention, it is preferred that a parallel mechanism robot that moves the base member while keeping the base member horizontal via a plurality of links be used as the moving mechanism. The parallel mechanism robot does not have an actuator in its movable part and therefore can keep the weight thereof low and can be driven at high speeds with a high degree of accuracy. Therefore, the base member to which the non-contact holding unit and the guide members are attached can be moved at extremely high speeds. Consequently, the use of the parallel mechanism robot as the moving mechanism can transfer the workpiece at high speeds while preventing the workpiece from shifting laterally.

The workpiece mounting device according to the present invention is used along with any of the transfer devices described above. This workpiece mounting device has a guide part that guides each of the plurality of guide members such that the guide members move away from each other as the non-contact holding unit configuring the transfer device approaches the workpiece mounting surface.

The workpiece mounting device according to the present invention can allow the plurality of guide members, which are disposed around the non-contact holding unit, to move away from each other as the non-contact holding unit approaches the workpiece mounting surface, by guiding the plurality of guide members along the guide part. Thus, when removing the workpiece or mounting the workpiece, the plurality of guide members can be spread to the outside of the rim part of the workpiece.

According to the present invention, each of the guide members, which prevents the workpiece from shifting laterally when being conveyed, can be prevented from coming into contact with the rim part of the workpiece when removing the workpiece from the workpiece mounting device and holding it or when mounting the workpiece on the workpiece mounting device.

DETAILED DESCRIPTION OF INVENTION

Figure 1:
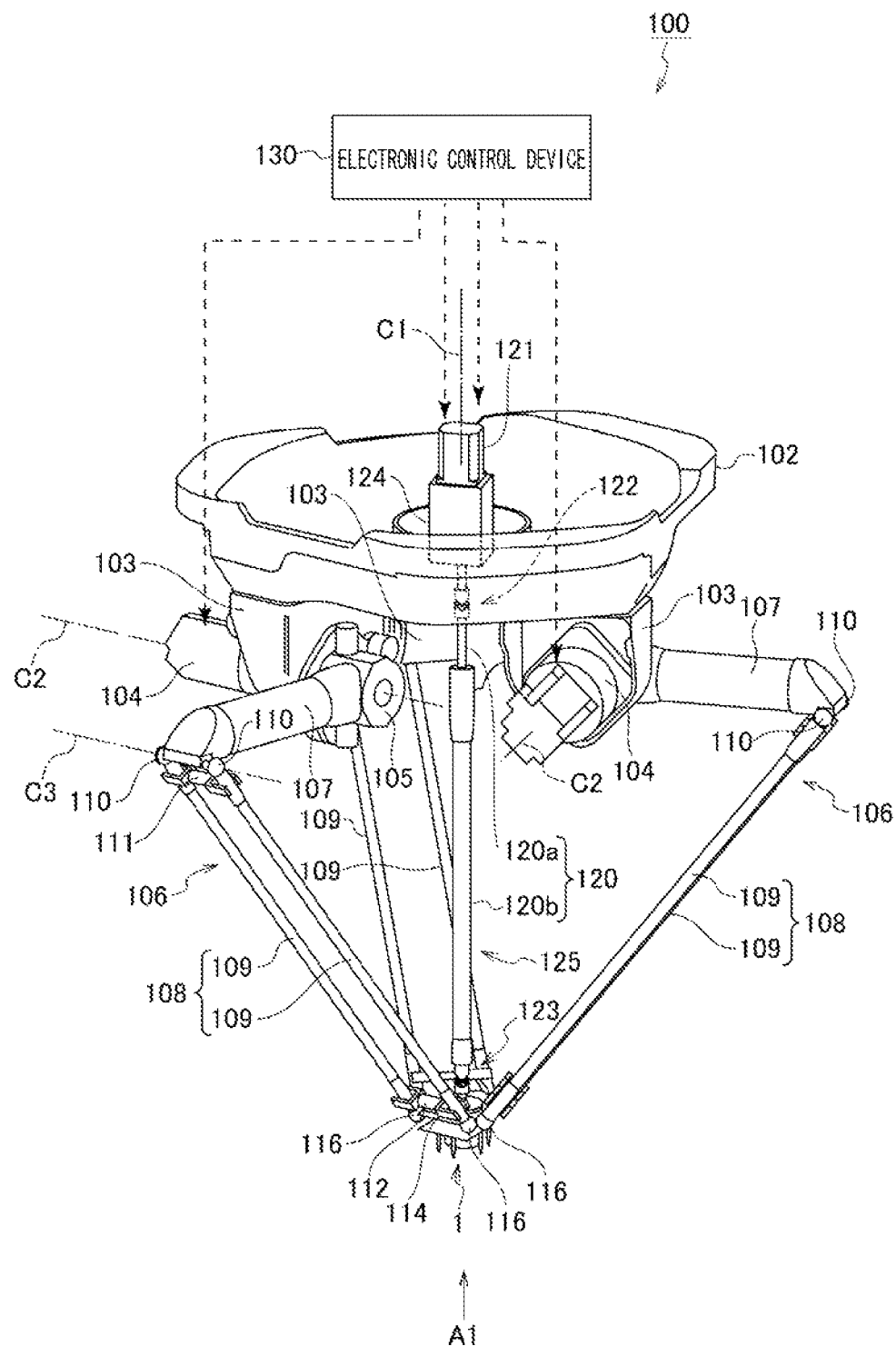
FIG. 1 is a perspective view showing the entire configuration of a parallel mechanism robot of a first embodiment to which a non-contact holding device is attached.

Preferred embodiments of the present invention are described hereinafter in detail with reference to the drawings. The same reference numerals are used to indicate the same elements in each diagram, and therefore the overlapping explanations are omitted accordingly.

Figure 2:
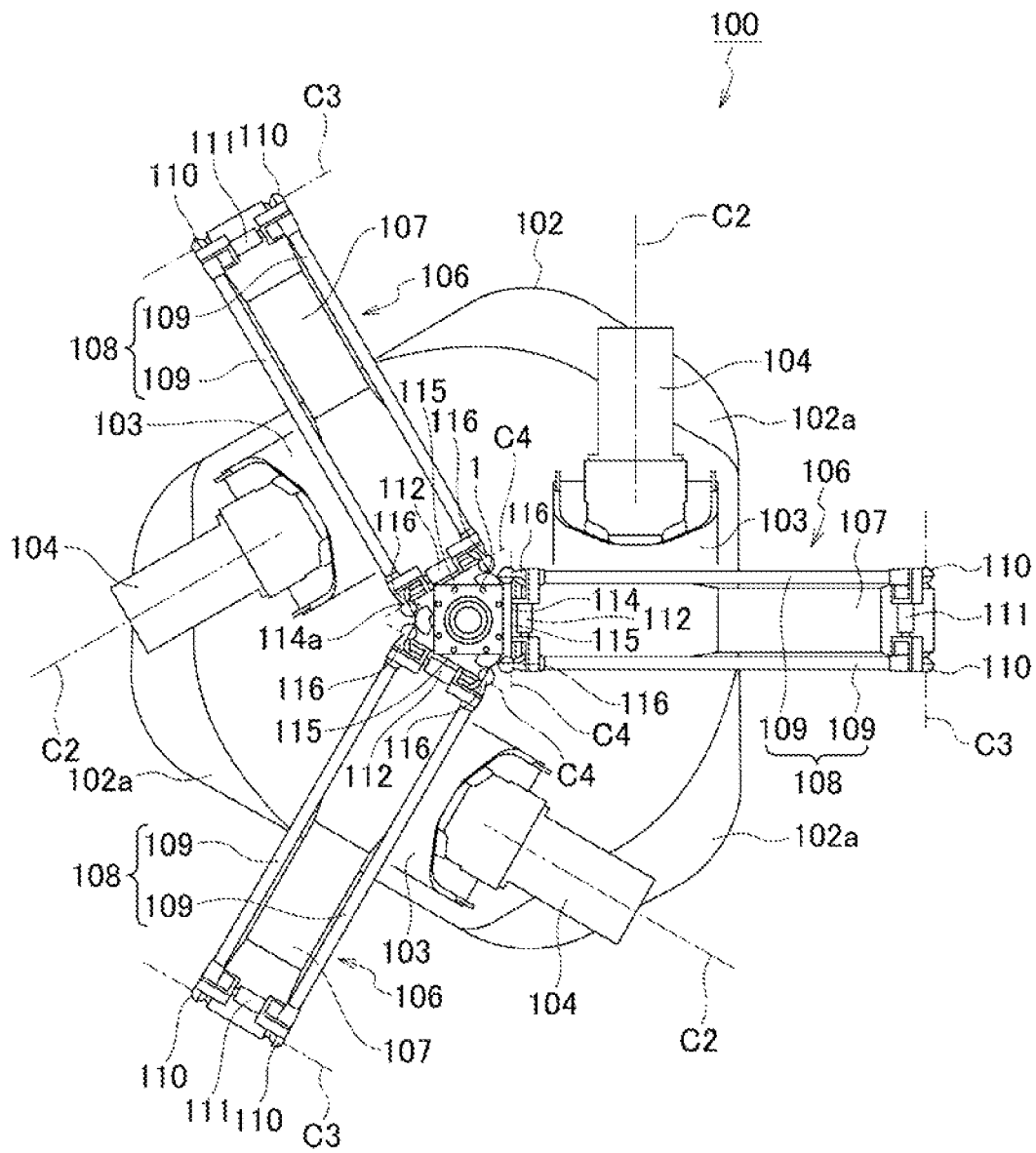
FIG. 2 is a diagram showing the parallel mechanism robot along a direction of an arrow A1 shown in FIG. 1.

First of all, the entire configuration of a parallel mechanism robot 100 (corresponding to the transfer device described in the patent claims) according to a first embodiment to which a non-contact holding device 1 is attached is described with reference to both FIGS. 1 and 2. FIG. 1 is a perspective view showing the entire configuration of the parallel mechanism robot 100 to which the non-contact holding device 1 is attached. FIG. 2 is a diagram showing the parallel mechanism robot 100 along a direction of an arrow A1 shown in FIG. 1.

The parallel mechanism robot 100 has a base part 102 in its upper part. The parallel mechanism robot 100 is supported by securing a flat attachment surface 102a (see FIG. 2), formed on a lower surface of the base part 102, to, for example, a horizontal ceiling or the like. The lower surface of the base part 102 is provided with three supporting members 103. Electric motors 104 are supported in the supporting members 103, respectively. Each of the electric motors 104 is supported in a manner that an axis line C2 of a motor shaft becomes parallel (i.e., horizontal) to the attachment surface 102a of the base part 102. The supporting members 103 are disposed at equal intervals (at every 120 degrees) around an axis line C1 extending along a perpendicular direction of the base part 102. The electric motors 104, also, are disposed at equal intervals (at every 120 degrees) around the axis line C1 extending along the perpendicular direction of the base part 102 (see FIG. 2).

An arm supporting member 105 in the shape of a substantially hexagonal cylinder is secured to an output shaft of each electric motor 104 so as to be coaxial with the axis line C2. By driving each electric motor 104, the arm supporting member 105 rotates around the axis line C2. Note that the electric motors 104 are connected to an electronic control device 130 that includes a motor driver. The electronic control device 130 controls the rotation of the output shafts of the electric motors 104.

The parallel mechanism robot 100 has three arm main bodies 106. Each of the arm main bodies 106 is configured by a first arm 107 and a second arm 108. The first arm 107 is a long hollow tubular member made of, for example, carbon fiber reinforced plastic (CFRP) or the like. A base end part of each first arm 107 is attached to a side surface of the corresponding arm supporting member 105. The first arm 107 is secured such that an axis line thereof is perpendicular to the axis line C2 described above.

A free end part of each first arm 107 is coupled to a base end part of the corresponding second arm 108. Each second arm 108 is configured so as to be able to swing around the free end part of the corresponding first arm 107. The second arm 108 is configured by a pair of long rods 109. The pair of rods 109 is disposed so as to become parallel to each other in a longitudinal direction thereof. Each of the rods 109 also is a long hollow tubular member made of, for example, carbon fiber reinforced plastic (CFRP) or the like. Base end parts of the rods 109 are coupled to the free end part of the first arm 107 by a pair of ball joints 110. Note that an axis line C3 that connects the ball joints 110 at the base end parts of the rods 109 is disposed so as to be parallel to the axis line C2 of each electric motor 104.

One of the rods 109 and the other rod 109 are coupled to each other by a coupling member 111 in the vicinity of the base end part of each second arm 108. In the vicinity of the free end part of each second arm 108, one of the rods 109 and the other rod 109 are coupled to each other by a coupling member 112. The coupling members 111 and 112 each have, for example, an extension coil spring that functions as a biasing member in order to bias the pair of rods 109 in a mutually pulling direction. The coupling members 111 and 112 may have different structures, but, in terms of cutting costs, it is preferred that the coupling members 111 and 112 have the same structure. The both coupling members 111 and 112 function to prevent the rods 109 from rotating around the axis line parallel to the longitudinal direction.

The parallel mechanism robot 100 also has a bracket 114 for attaching the non-contact holding device 1 (the detail thereof is described later) turnably thereto. The bracket 114 is a plate-like member having a substantially regular triangular shape. The bracket 114 is held by the three arm main bodies 106 in a manner that an attachment surface 114a (a lower surface of the bracket 114 in FIG. 1) of the bracket 114 to which the non-contact holding device 1 is attached becomes parallel (i.e., horizontal) to the attachment, surface 102a of the base part 102.

In other words, an attachment piece 115 is formed on each side of the bracket 114. By coupling each attachment piece 115 to a free end part of each arm main body 106 (the free end part of each of the pair of rods 109 configuring each second arm 108), the bracket 114 can swing around the free end parts of the arm main bodies 106 with respect to the arm main bodies 106. More specifically, end parts of the attachment pieces 115 of the bracket 114 are coupled to the free end parts of the rods 109 by ball joints 116. An axis line C4 (see FIG. 2) connecting a pair of ball joints 116 is parallel to the axis line C3 corresponding to each arm main body 106 due to the equal distance between the ball joint parts 110 and 116 of all the rods 109. Therefore, the axis line C4 is parallel to the axis line C2 of each electric motor 104 as well. When each of the arm main bodies 106 is driven, the bracket 114 swings with respect to each of the arm main bodies 106 by moving parallel to a horizontal plane. Then, the bracket 114 is supported by the three arm main bodies 106 so that the bracket 114 can move parallel to the horizontal plane in all of the sides of the substantially regular triangular bracket 114.

As described above, the distance between the pair of ball joints 110 at the coupling part between each first arm 107 and each second arm 108 is set to be equal to the distance between the pair of ball joints 116 at the coupling part between each rod 109 of the second arm 108 and the bracket 114. Therefore, the pair of rods 109 configuring each second arm 108 is disposed so as to be always parallel to each other in the entire length of the longitudinal direction. Because all the axis lines C2, C3, C4 are parallel to the attachment surface 102a of the base part 102, the attachment surface 114a of the bracket 114, to which the non-contact holding device 1 is attached, and the attachment surface 102a of the base part 102 are kept parallel to each other even when each of the three first arms 107 turns around the axis line C2 in any way.

In response to a command from the electronic control device 130, the position of rotation of the arm supporting member 105 fixed to the output shaft of each electric motor 104 is controlled. Consequently, the position of the free end part of each first arm 107 is controlled. The position of the free end part of each second arm 108 follows the controlled position of the free end part of each first arm 107. As a result, the position of the attachment surface 114a of the bracket 114, to which the non-contact holding device 1 is attached, is determined uniquely. At this moment, the bracket 114 moves while keeping its horizontal position, as described above.

The parallel mechanism robot 100 further has a pivot rod 120 extending downward from the base part 102 at the center of the base part 102, and an electric motor 121 for rotating the pivot rod 120. The electric motor 121 is secured to the base part 102 while having a shaft output thereof directed perpendicularly downward. One end part of the pivot rod 120 is coupled to the output shaft of the electric motor 121 via a universal coupling ("universal joint," hereinafter) 122 and a speed reducer 124 configured by a combination of a plurality of gears. Note that in the present embodiment the reduction ratio of the speed reducer 124 is 5. The other end part of the pivot rod 120 is connected to the non-contact holding device 1 via a universal joint 123. Moreover, the non-contact holding device 1 and a lower connecting part of the universal joint 123 are rotatably secured to the bracket 114 by a bearing such that central axes thereof extend perpendicularly.

The pivot rod 120 is realized by a rod 120a and a cylinder 120b, and configured to be able to stretch and retract freely. The pivot rod 120 is a ball spline that is capable of transmitting a rotary movement of the rod 120a to the cylinder 120b. Even when the bracket 114 is driven by the three electric motors 104 and moved to predetermined upper, lower, forward, rearward, left, or right position, adopting the universal joints 122, 123 for the both end parts of the pivot rod 120 can allow the pivot rod 120 to move based on the predetermined position. Hereinafter, a configuration including the pivot rod 120 and the universal joints 122 and 123 is referred to as "pivot 125."

In other words, such machine elements as the speed reducer 124, the universal joint 122, the pivot rod 120 (the rod 120a and the cylinder 120b), and the universal joint 123 are connected in series between the electric motor 121 and the non-contact holding device 1, and rotary drive force of each electric motor 121 is transmitted to the non-contact holding device 1 through these serially connected machine elements. The electric motor 121 is connected to the electronic control device 130. A rotational angular position of the non-contact holding device 1 is controlled by controlling a rotary movement of the electric motor 121 by means of the electronic control device 130.

As described above, the electronic control device 130 drives the arm main bodies 106 by controlling the three electric motors 104 to move the non-contact holding device 1 to a target position. The electronic control device 130 also drives the pivot rod 120 by controlling the electric motor 121 to rotate the non-contact holding device 1 to a target rotational angular position. For example, a programmable logic controller (PLC), a dedicated control computer or the like can favorably be used as the electronic control device 130. The electronic control device 130 is configured by a microprocessor for performing calculations, a ROM for storing a program for causing the microprocessor to execute processes, and a RAM for temporarily storing various data such as a calculation result.

Furthermore, an input/output device 131, which functions as setting means for receiving an operational input from an operator and display means for displaying a status and settings of the parallel mechanism robot 100, is connected to the electronic control device 130. Note that, for example, a touch panel display, a liquid crystal display, a keyboard or the like is favorably used as the input/output device 131. The operator can set control data of each of the electric motors 104, 121 by using the input/output device 131. The electronic control device 130 drives the electric motors 104 and the electric motor 121 by executing the programs stored in the ROM by using the set control data, and controls a position (x, y, z) in a three-dimensional space and rotational angle (θ) of the non-contact holding device 1.

Figure 3:
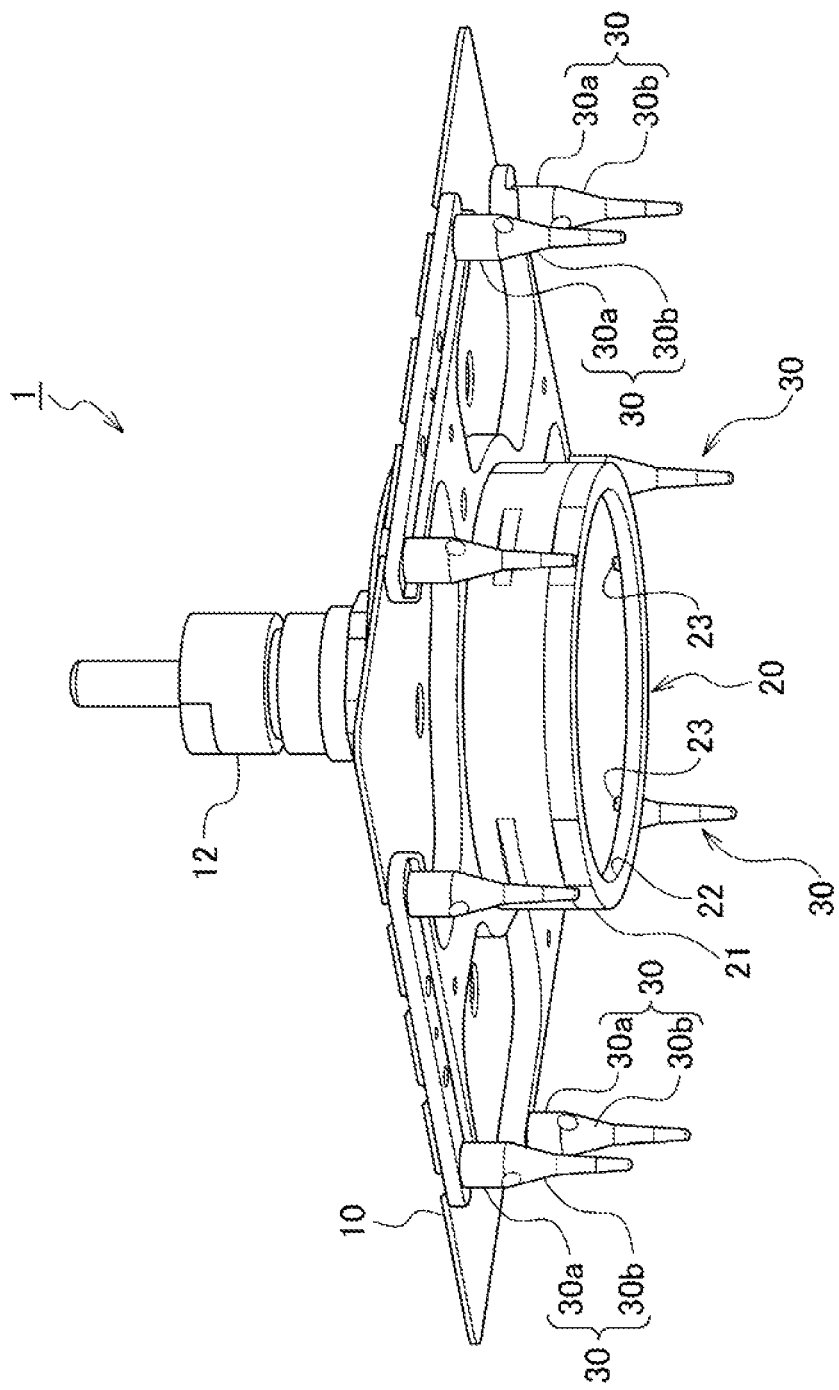
FIG. 3 is a perspective view showing a bottom surface of the non-contact holding device.

Next, a structure of the non-contact holding device 1 attached to the other end of the pivot rod 120 via the bracket 114 is described with reference to FIG. 3. FIG. 3 is a perspective view showing a bottom surface of the non-contact holding device 1.

The non-contact holding device 1 has a Bernoulli chuck 20 that ejects high-pressure air to generate suction force for holding a workpiece 80 (see FIG. 8, etc.) in a non-contact manner, a plurality of (eight, in the present embodiment) guide members 30 that are disposed at predetermined intervals around the Bernoulli chuck 20 and prevent the workpiece 80 from shifting laterally when the workpiece 80 is conveyed, and a chuck base (corresponding to the base member described in the patent claims) 10 to which the Bernoulli chuck 20 and the guide members 30 are attached.

The chuck base 10 is a square plate-like member slightly larger than the workpiece 80 to be held. The chuck base 10 is formed of lightweight industrial plastic having the advantage of strength. It is preferred that the shape, size and the like of the chuck base 10 be set according to the shape and size of the workpiece to be held. An attachment 12 is attached to a center of an upper surface of the chuck base 10. This attachment 12 connects the chuck base 10 to the pivot rod 120 with the bracket 114 therebetween. The chuck base 10 can be turned by the pivot rod 120.

The Bernoulli chuck 20 has a tubular main body 21 that is attached to a lower surface of the chuck base 10. A concave part 22 is formed on an end surface of the tubular main body 21. The Bernoulli chuck 20 is attached in a manner that an opened surface of the concave part 22 formed on the main body 21 faces the workpiece 80 to be held, i.e., in a manner that the opened surface of the concave part 22 faces downward. The opened surface of the main body 21 of the Bernoulli chuck 20 forms a workpiece holding surface for holding the workpiece 80 in a non-contact manner.

A surface of the main body 21 that faces the concave part 22 has a plurality of ejection holes 23 (four ejection holes disposed at every 90 degrees in the present embodiment) for ejecting high-pressure air into the concave part 22. The ejection holes 23 penetrate obliquely downward through the main body 21, from a side surface of the main body 21 to a bottom surface of the concave part 22, so as to contact an inner circumferential surface of the concave part 22. An air pipe (not shown) is attached to each of the ejection holes 23. The air pipes are connected to an air pump (not shown) for supplying the high-pressure air.

When the high-pressure air is supplied from the air pump to the ejection holes 23 via the air pipes, the high-pressure air is ejected into the concave part 22 through the ejection holes 23. The ejected high-pressure air proceeds obliquely downward along the inner circumferential surface of the concave part 22 and is discharged from a gap between an opened end surface and the workpiece 80. Consequently, the flow speed of the high-pressure air increases when the high-air pressure enters the opened end surface from the inner circumferential surface of the concave part 22, reducing internal pressure of the concave part 22. The resultant negative pressure generates suction force on the workpiece 80. As a result, the workpiece 80 is held ti a non-contact manner. The Bernoulli chuck 20 functions as the non-contact holding unit described in the patent claims.

The lower surface of the chuck base 10 is provided with a plurality of pin-like guide members 30 (eight, in the present embodiment) protruding vertically with respect to the chuck base 10. These eight guide members 30 are disposed at intervals around the Bernoulli chuck 20 so as to surround the workpiece 80 when the workpiece 80 is conveyed. More specifically, the guide members 30 are disposed in pairs (a total of four pairs) at intervals on the sides of the chuck base 10, such that a pair of guide members 30 faces the other with the Bernoulli chuck 20 therebetween. In a steady state, the guide members 30 are disposed so as to substantially abut with the held workpiece 80, i.e., so as to obtain a clearance of approximately 0.1 to 0.2 mm between each guide member 30 and each of the sides of the workpiece 80. The arrangement of the guide members 30 can be set according to the shape and the like of the workpiece 80.

Each of the guide members 30 includes a tubular base end part 30a having one end attached to the chuck base 10, and a substantially conic tip end part 30b extending from the base end part 30a. The total length of each guide member 30) is set to be longer than the size in a height direction of the Bernoulli chuck 20. The tip end of each guide member 30 projects downward below the workpiece holding surface of the Bernoulli chuck 20. Each of the guide members 30 is formed of, for example, UHPE (Ultra High Molecular Weight Polyethylene), PEEK (polyether ether ketone), or polymer material in which these abovementioned materials are filled with PTFE (poly tetrafluoroethylene) or the like to reduce friction.

The guide members 30 facing each other are configured to be able to move away from each other. When the workpiece 80 is removed from a workpiece mounting tray 70 (see FIGS. 5 and 6) on which the workpiece 80 is disposed on the removal side or when the held workpiece 80 is mounted on a workpiece mounting tray 71 (see FIG. 7) on the mounting side, the guide members 30 move away from each other along guide holes 72 formed on the workpiece mounting tray 70, 71 as the non-contact holding device 1 (Bernoulli chuck 20) approaches a workpiece mounting surface 75 of the workpiece mounting tray 70, 71. Note that the workpiece mounting tray 70, 71 corresponds to the workpiece mounting device described in the patent claims. The guide holes 72 each correspond to the guide part described in the patent claims.

Figure 4:
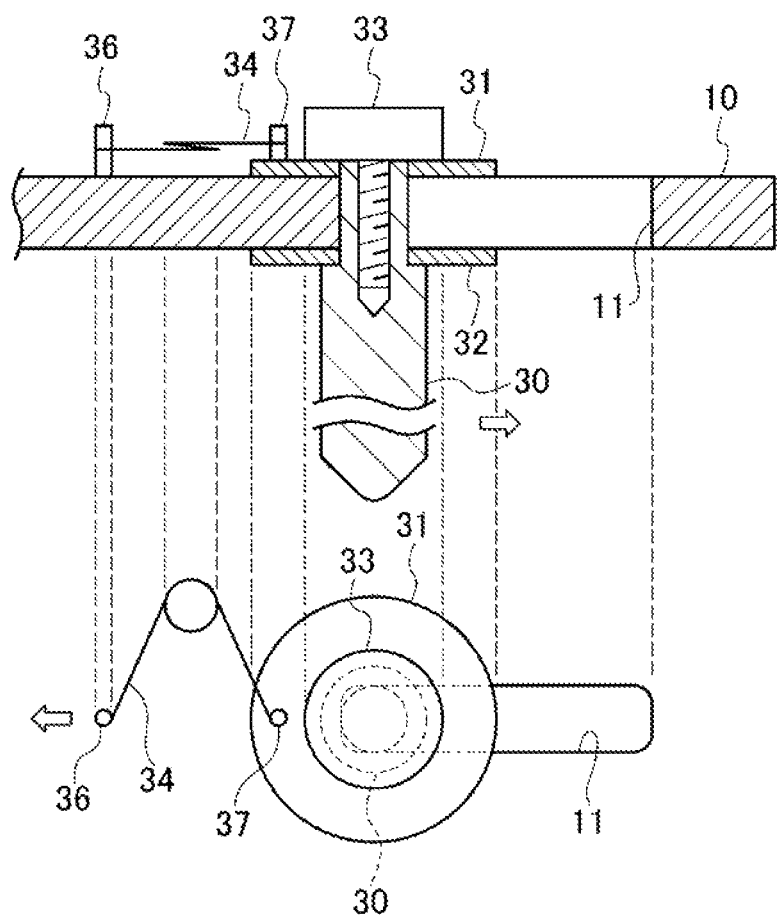
FIG. 4 is a schematic diagram showing an enlargement of a movable mechanism of one of guide members of the non-contact holding device.

A movable mechanism of each guide member 30 is now described with reference to FIG. 4. FIG. 4 is a schematic diagram showing an enlargement of the movable mechanism of one of the guide members 30. Movable mechanisms of the rest of the guide members 30 have the same configuration. A long hole 11 extending perpendicular to each of the sides of the chuck base 10 is formed on an end part of each side of the chuck base 10. The guide member 30 is provided such that an upper end thereof penetrates through the long hole 11 and two washers 31, 32 that are provided above and below the chuck base 10 so as to hold the chuck base 10 therebetween. The guide member 30 and the washers 31, 32 are fastened to each other by means of a screw 33 at the upper end of the guide member 30. Therefore, the pin-like guide member 30 is attached to the long hole 11 in a manner that the guide member 30 can slide along the long hole 11 without coming off of the long hole 11.

A torsion spring 34 is attached to the upper surface of the chuck base 10. The torsion spring 34 is disposed facing inward of the long, hole 11 along an axis line of the long hole 11 so as to generate biasing force (tension force) in an internal direction along the direction of the axis line of the long hole 11. The torsion spring 34 has its one end latched to the upper surface of the chuck base 10 via a pin 36 and the other end to the washer 31 via a pin 37, the washer 31 being attached to the upper surface of the chuck base 10. The other end of the torsion spring 34 may be latched so as to be coaxial with a head part of the screw 33. In this manner, the torsion spring 34 applies the biasing force to the guide member 30 so as to bring the guide member 30 into abutment with one end (internal side) of the long hole 11.

By being biased by the torsion spring 34 as described above, the guide member 30 is brought into abutment with one end (internal side) of the long hole in the steady state. In other words, in the steady state, the guide member 30 is disposed so as to substantially abut with the held workpiece 80, i.e., so as to obtain a clearance of approximately 0.1 to 0.2 mm between each of the guide members 30 and each of the sides of the workpiece 80. On the other hand, when removing the workpiece 80 from the workpiece mounting tray 70 described hereinafter or when mounting the workpiece 80 on the workpiece mounting tray 71, the guide members 30 that face each other are forced to move away from each other along the long hole 11 (to the outside) by the guide holes 72 formed on the workpiece mounting tray 70, 71. At this moment, the more the guide members 30 move away from each other along the long hole 11, the more the biasing force is applied by the torsion springs 34 to the guide members 30 to bring the guide members 30 close to each other. After the workpiece 80 is removed from the workpiece mounting tray 70 or after the workpiece 80 is mounted on the workpiece mounting tray 71, the guide members 30 facing each other are forced to move towards each other along the guide holes 72 of the workpiece mounting tray 70, 71 by the biasing force of the torsion springs 34 as the Bernoulli chuck 20 separates from the workpiece mounting surface of the workpiece mounting tray 70, 71. Consequently, the guide members 30 return to the steady positions thereof.

Figure 5:
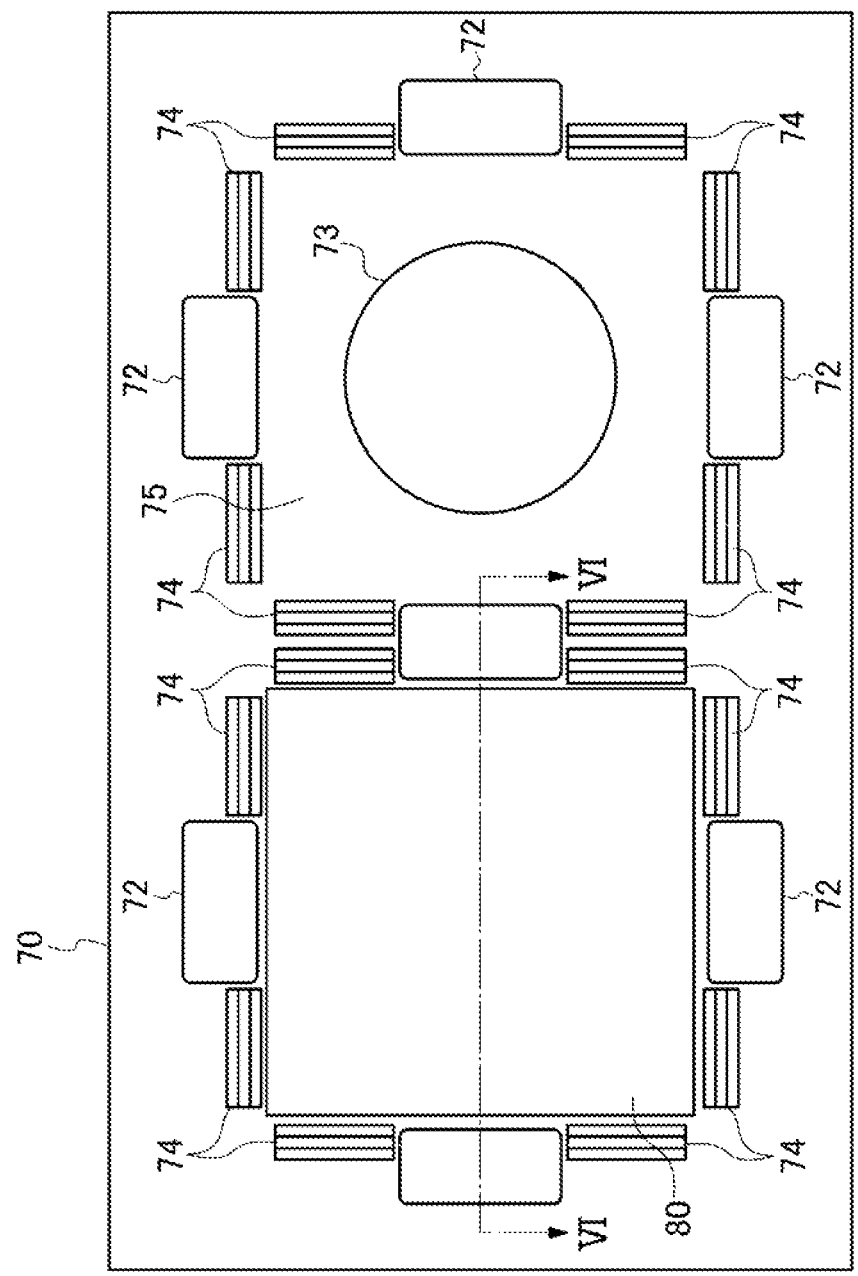
FIG. 5 is a plan view of a workpiece mounting tray on the removal side.
Figure 6:
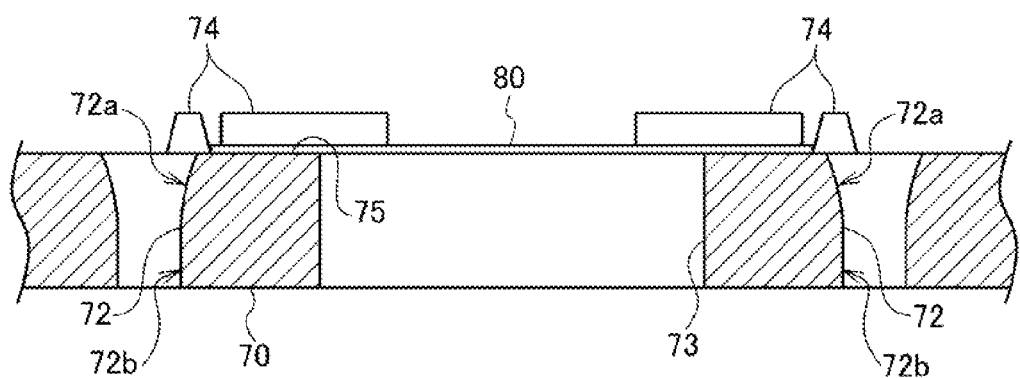
FIG. 6 is a cross-sectional diagram of the workpiece mounting tray on the removal side, the cross-sectional view being taken along line VI-VI of FIG. 5.
Figure 7:
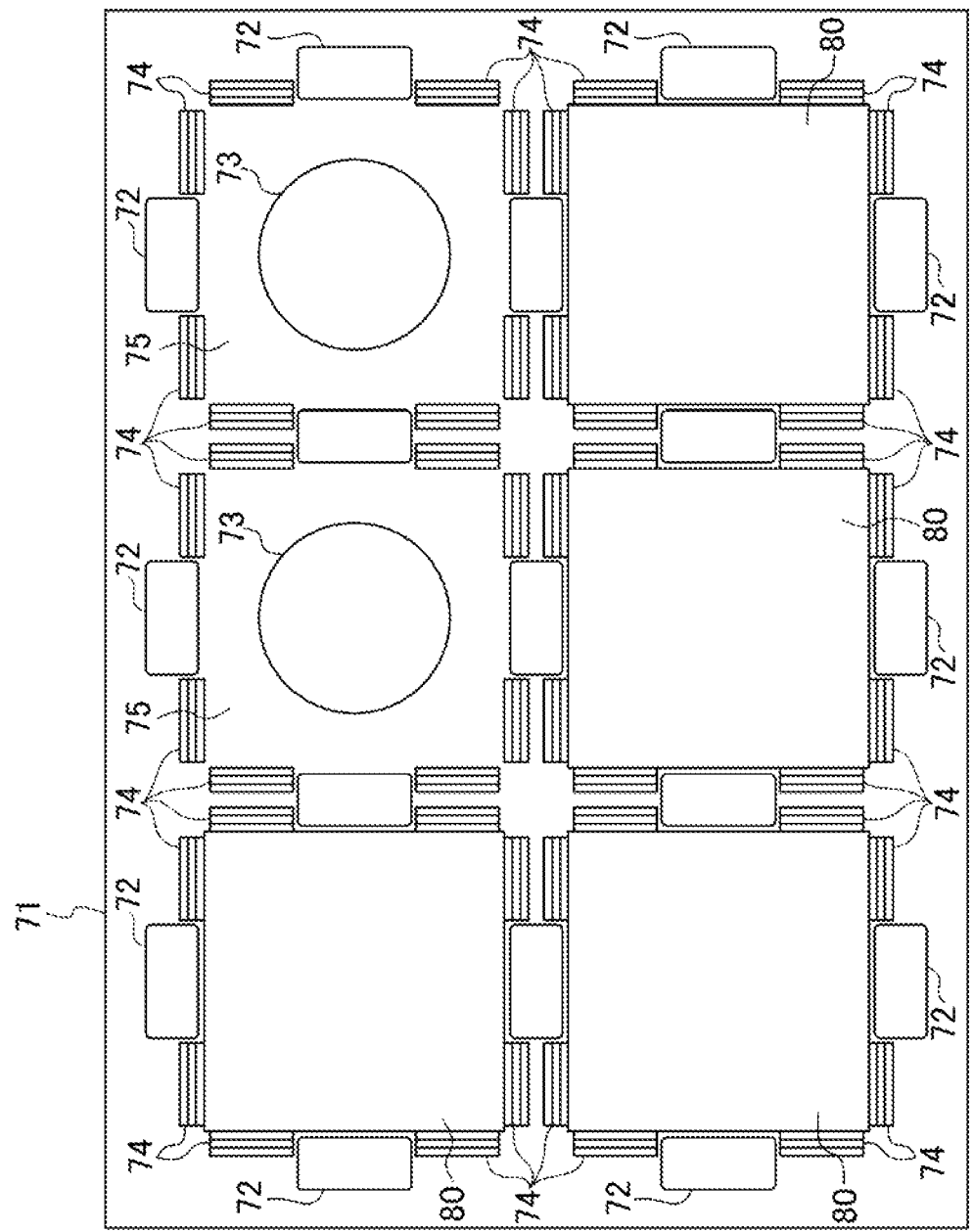
FIG. 7 is a plan view of a workpiece mounting tray on the mounting side.

Next is described, with reference to FIGS. 5 to 7, the workpiece mounting trays 70, 71 that are used along with the parallel mechanism robot 100 attached with the non-contact holding device 1 when the workpiece 80 is mounted thereon. FIG. 5 is a plan view of the workpiece mounting tray 70 on the removal side. FIG. 6 is a vertical cross-sectional diagram of the workpiece mounting tray 70, taken along line VI-VI of FIG. 5. FIG. 7 is a plan view of the workpiece mounting tray 71 on the mounting side. The workpiece mounting tray 70 on the removal side on which the workpiece 80 to be held is mounted and the workpiece mounting tray 71 on the mounting side on which the held workpiece 80 is to be mounted, have the same configuration, except for the number of workpieces 80 that can be mounted. Incidentally, the workpiece mounting tray 70 on the removal side has two workpiece mounting surfaces 75 so that two workpieces 80 can be mounted thereon. The workpiece mounting tray 71, on the other hand, has six (2×3) workpiece mounting surfaces 75 so that six workpieces 80 can be mounted thereon. Note that FIG. 5 shows a state in which the workpiece 80 is mounted only on the workpiece mounting surface 75 to the left of the diagram. FIG. 6 shows a state in which the workpieces 80 are mounted on four workpiece mounting surfaces 75.

The square workpiece mounting surfaces 75 for mounting the workpieces 80 thereon are formed on upper surfaces of the workpiece mounting trays 70, 71. The workpiece mounting surfaces 75 have substantially the same size as the workpieces 80. Each of the substantially rectangular guide holes 72 for guiding the guide members 30 is formed outside a substantially central part of each side of each workpiece mounting surface 75 along the side. An inner surface of each guide hole 72 includes an inclination part (inclination region) 72a inclining from an opening to the center of the hole and a perpendicular part (perpendicular region) 72b extending smoothly downward from the inclination part 72a. The guide holes 72 guide the guide members 30 such that the guide members 30 facing each other move away from each other along the inclination parts 72a as the Bernoulli chuck 20 descends and approaches the workpiece mounting surfaces 75. The guide holes 72 also guide the guide members 30 such that the guide members 30 facing each other come close to each other along the inclination parts 72a as the Bernoulli chuck 20 rises and moves away from the workpiece mounting surfaces 75. Two of the guide members 30 can enter a single guide hole 72.

Both sides of each of the guide holes 72 of the workpiece mounting trays 70, 71 are provided with workpiece guiding protruding parts 74 having a trapezoidal cross section, along each side of each workpiece mounting surface 75. When the workpiece 80 is mounted, the workpiece guiding protruding parts 74 lead the workpiece 80 to a predetermined position. In other words, when the workpiece 80 held by the Bernoulli chuck 20 is mounted, this workpiece 80 is led along inclined surfaces of the workpiece guiding protruding parts 74 and mounted on a predetermined position on the workpiece mounting surface 75.

Furthermore, a circular through-hole 73 is formed at a central section of each workpiece mounting surface 75. The through-hole 73 is an air-bleeding hole that is supplied with air from below when the workpiece 80 is removed by the Bernoulli chuck 20, to prevent the workpiece mounting trays 70, 71 from being pulled by the negative pressure.

Figure 8:
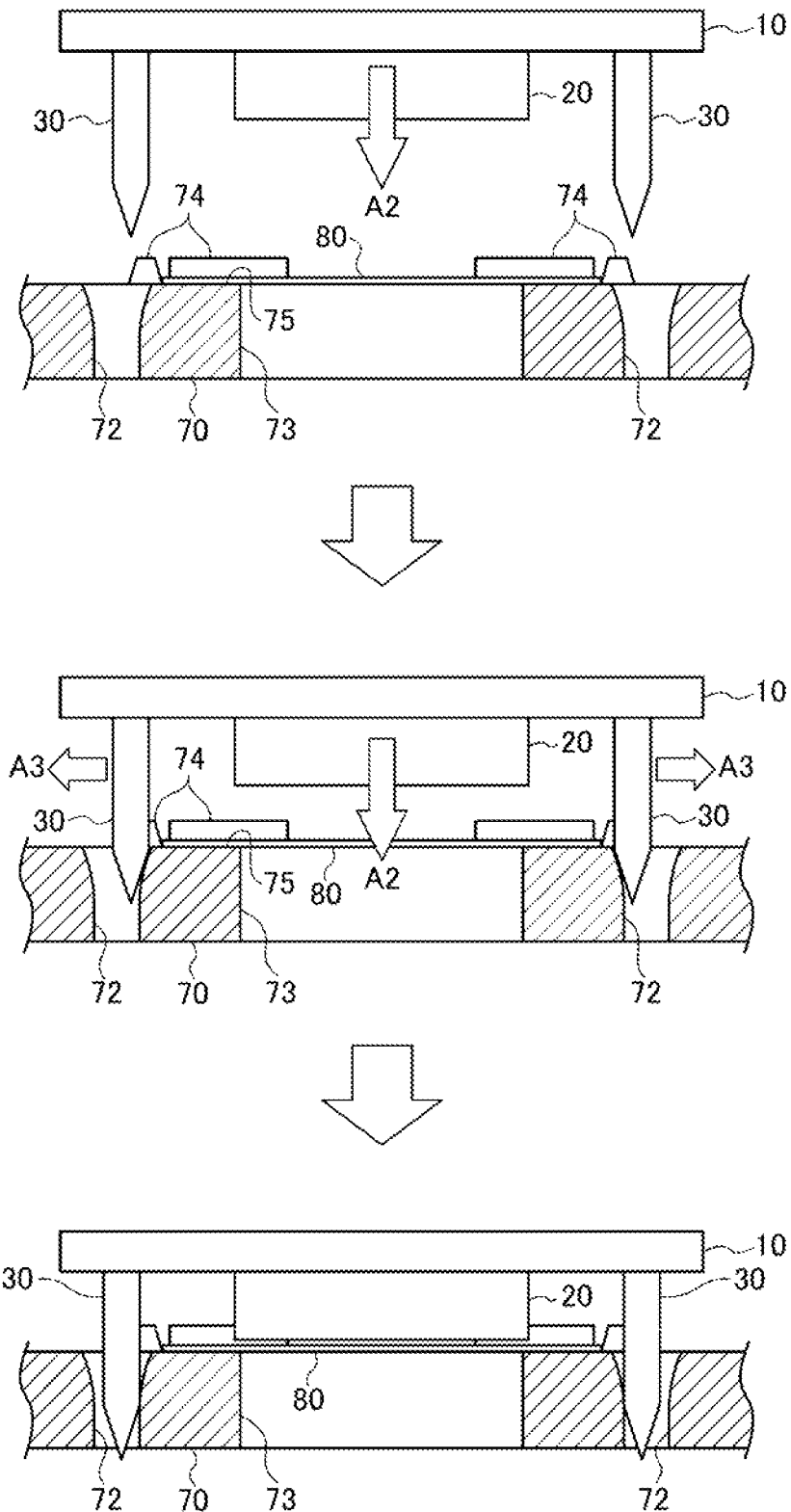
FIG. 8 is a diagram for explaining how the guide members are operated by the non-contact holding device.

Next is described, with reference to FIG. 8, how each guide member 30 moves when the workpiece 80 is removed by the Bernoulli chuck 20. FIG. 8 is a diagram for explaining how the guide members 30 are operated by the non-contact holding device 1, showing a time sequence of how the guide members 30 are moved when the Bernoulli chuck 20 removes the workpiece 80. First, as shown in the top diagram of FIG. 8, the Bernoulli chuck 20 descends perpendicularly (arrow A2) to approach the workpiece mounting surface 75 of the workpiece mounting tray 70.

Subsequently, as shown in the middle diagram of FIG. 8, the guide members come into contact with the inner surfaces of the guide holes 72. As the Bernoulli chuck 20 descends to approach the workpiece mounting surface 75, the guide members facing each other are gradually expanded to move away from each other (arrows A3) along the inclination parts 72$a$ of the guide holes 72. Therefore, each of the guide members 30 does not come into contact with a rim part of the workpiece 80.

Then, as shown in the bottom diagram of FIG. 8, the Bernoulli chuck 20 holds the workpiece 80 in a non-contact manner, while the guide members 30 facing each other are expanded by the guide holes 72. Consequently the workpiece 80 can be held and removed, without having the guide members 30 contact the rim parts of the workpiece 80. After removing the workpiece 80, the Bernoulli chuck 20 rises perpendicularly. As the Bernoulli chuck 20 moves away from the workpiece mounting surface 75 of the workpiece mounting tray 70, the guide members 30 facing each other are forced to move towards each other along the inner surfaces of the guide holes 72 of the workpiece mounting tray 70 by the biasing force of the torsion spring 34, to return to the steady positions. Meanwhile, the workpiece 80 is suctioned and held by the Bernoulli chuck 20. The relative position between the workpiece 80 and the guide members 30 does not change in the height direction, but the clearance therebetween becomes narrow gradually. Thus, the workpiece 80 is restricted in lateral movement without being rubbed in an axial direction of the guide members 30. In this manner, the workpiece 80 is prevented from shifting laterally when being conveyed.

Figure 9:
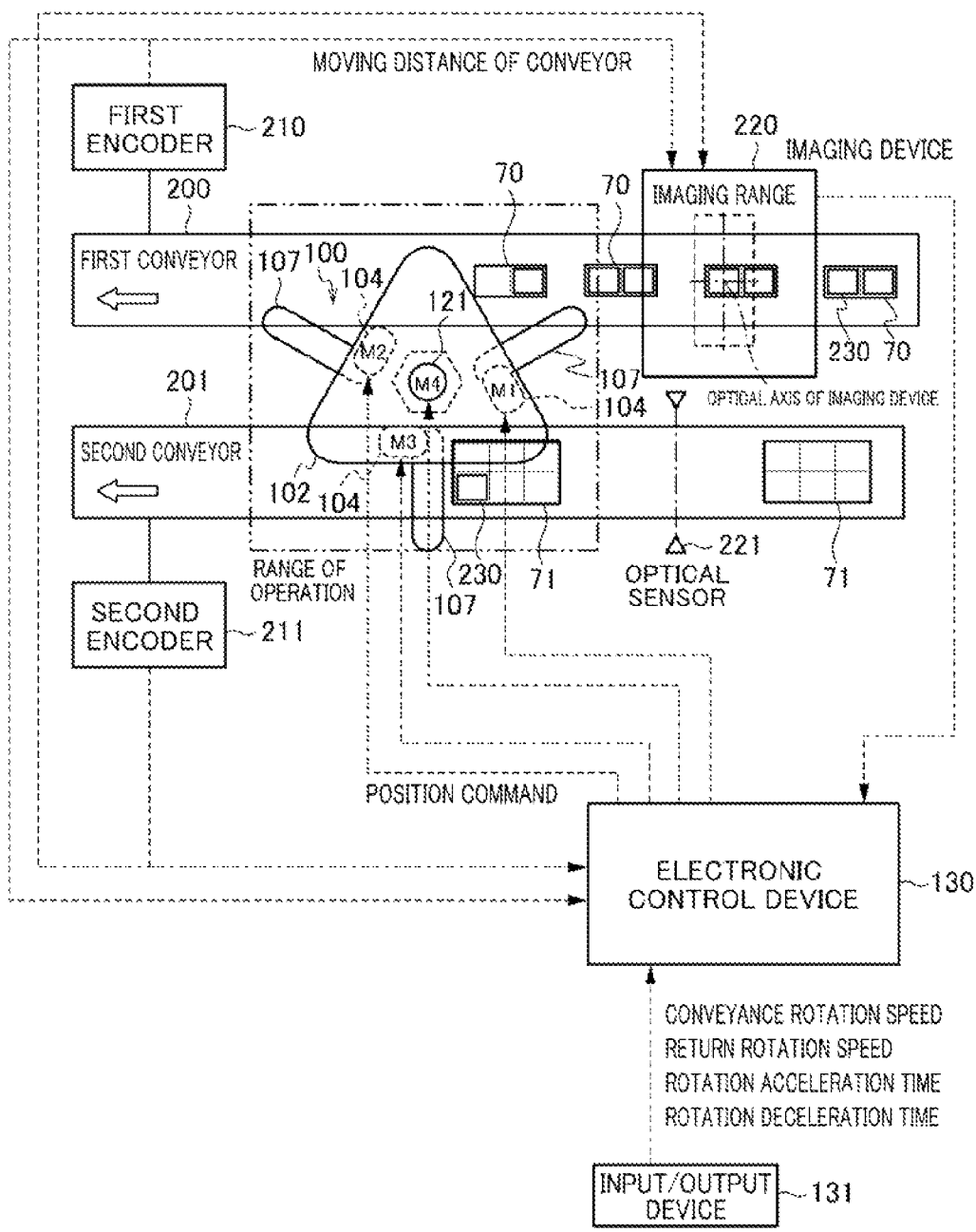
FIG. 9 is a bird's eye view for explaining a brief outline of a step of palletizing a solar cell wafer.

Next, operations of the parallel mechanism robot 100 are described with reference to FIG. 9. Here is described an example of a step of palletizing solar cell wafers (workpiece), wherein the non-contact holding device 1 (Bernoulli chuck 20) removes solar cell wafers 230 from the workpiece mounting tray 70 on the removal side and thereafter conveys the solar cell wafers 230 to the workpiece mounting tray 71 on the mounting side while adjusting rotational angular positions of the solar cell wafers 230. Note that the series of operations between conveying the solar cell wafers 230 to removing the solar cell wafers 230 is same as or similar to the operations described hereinafter, except that the operations described hereinafter are carried out in reverse order; thus the descriptions thereof are omitted. Note that FIG. 9 is a bird's eye view for explaining a brief outline of the step of palletizing the solar cells.

First, a brief outline of the step of palletizing the solar cell wafers 230 is described with reference to FIG. 9. In this step, a first conveyor 200 and second conveyor 201 are disposed parallel to each other, and the parallel mechanism robot 100 is installed above these two conveyors. Each of the first and second conveyors 200 and 201 repeatedly moves from the right-hand side of the diagram to the left-hand side at a predetermined speed or repeatedly moves and stops at a pitch.

The solar cell wafers 230 are mounted on the workpiece mounting tray 70 on the removal side and flow on the first conveyor 200. Each of the solar cell wafers 230 is a square thin plate of, for example, 156 mm L×1.56 mm W×0.1 to 0.2 mm H. On the other hand, the solar cell wafers 230 are aligned and accommodated on the workpiece mounting tray 71 on the mounting side, which flows on the second conveyor 201. The workpiece mounting tray 71 on the mounting side has six (2×3) workpiece mounting surfaces 75 that are divided into cells. The solar cell wafers 230 that are mounted on the workpiece mounting tray 70 are transferred to the respective workpiece mounting surfaces 75 of the workpiece mounting tray 71 by the parallel mechanism robot 100.

The parallel mechanism robot 100 drives the arm main bodies 106 to move the non-contact holding device 1 (the Bernoulli chuck 20) and approaches the solar cell wafers 230 mounted on the workpiece mounting tray 70. Thereafter, the parallel mechanism robot 100 removes the solar cell wafers 230 by means of the non-contact holding device 1 and conveys the solar cell wafers 230 to the workpiece mounting tray 71. The parallel mechanism robot 100 repeatedly executes these operations. The parallel mechanism robot 100 also aligns the orientation of each square solar cell wafer 230 with the orientation of each workpiece mounting surface 75 of the workpiece mounting tray 71 by rotating the non-contact holding device 1 when holding and conveying each solar cell wafer 230, and then accommodates the solar cell wafers 230 in the respective workpiece mounting surfaces 75 of the workpiece mounting tray 71.

More specifically, a first encoder 210 for detecting a moving distance of the first conveyor 200 is attached to the first conveyor 200. The first encoder 210 outputs the detected moving distance of the first conveyor 200 to the electronic control device 130. On the other hand, a second encoder 211 for detecting a moving distance of the second conveyor 201 is attached to the second conveyor 201. The second encoder 211 outputs the detected moving distance of the second conveyor 201 to the electronic control device 130. Furthermore, an imaging device 220 such as a CCD camera is provided above the first conveyor 200. The imaging device 220 captures an image of each solar cell wafer 230 mounted on the flowing workpiece mounting tray 70 to obtain the center of gravity and orientation (angle) of each solar cell wafer 230, and outputs the results to the electronic control device 130. In addition, an optical sensor 221 for detecting a leading end part of the workpiece mounting tray 71 is attached to the second conveyor 201. The optical sensor 221 outputs a detection signal to the electronic control device 130. Even when the workpiece mounting tray 70 flows on the first conveyor 200 at an irregular pitch or in any orientation (angle), the electronic control device 130 can appropriately control the position of the non-contact holding device 1 to remove the solar cell wafers 230, based on the rotation of the non-contact holding device 1 and the positions detected by the imaging device 220, as described above.

The electronic control device 130 calculates the position of each solar cell wafer 230 based on the center of gravity of each solar cell wafer 230 and the moving distance of the first conveyor 200. The electronic control device 130 further calculates the position of the workpiece mounting tray 71 based on a detection signal of the leading end part of the workpiece mounting tray 71 and the moving distance of the second conveyor 201. Based on the obtained positions of the solar cell wafers 230 and the obtained position of the workpiece mounting tray 71, the electronic control device 130 rotates the electric motors 104 drives the arm main bodies 106, accesses the solar cell wafers 230 from above, the solar cell wafers 230 being placed horizontally on the workpiece mounting tray 70, removes each solar cell wafer 230, conveys the removed solar cell wafer 230 within the space, accesses the workpiece mounting tray 71 from above, and mounts the held solar cell wafer 230 on the workpiece mounting tray 71 horizontally.

More specifically, when removing each solar cell wafer 230 from the workpiece mounting tray 70, the Bernoulli chuck 20 descends perpendicularly to approach the workpiece mounting surface 75 of the workpiece mounting tray 70. Subsequently, the guide members 30 come into contact with the inner surfaces of the guide holes 72. The guide members 30 lacing each other are expanded gradually to move away from each other along the inclination parts 72a of the guide holes 72 as the Bernoulli chuck 20 descends and approaches the workpiece mounting surface 75. Then, while the guide members 30 are expanded by the guide holes 72, the Bernoulli chuck 20 holds the solar cell wafer 230 in a non-contact manner. Consequently, the solar cell wafer 230 can be held and removed while keeping the guide members 30 away from the rim parts of the solar cell wafer 230. After the solar cell, wafer 230 is removed by the Bernoulli chuck 20, the guide members 30 facing each other are forced to move towards each other along the inner surfaces of the guide holes 72 of the workpiece mounting tray 70 by the biasing force of the torsion spring 34 as the Bernoulli chuck 20 rises and separates from the workpiece mounting surface 75 of the workpiece mounting tray 70. The guide members 30 then return to the steady positions thereof. In this manner, each of the solar cell wafers 230 can be prevented from shifting laterally when being conveyed.

Similarly, when mounting each solar cell wafer 230 on the workpiece mounting tray 71, the Bernoulli chuck 20 holding the solar cell wafer 230 descends perpendicularly to approach the corresponding workpiece mounting surface 75 of the workpiece mounting tray 71. Thereafter, the guide members 30 come into contact with the inner surfaces of the guide holes 72. As the Bernoulli chuck 20 descends to approach the workpiece mounting surface 75, the guide members 30 facing each other are expanded gradually to move away from each other along the inclination parts 72a of the guide holes 72. Then, while the guide members 30 are expanded by the guide holes 72, the Bernoulli chuck 20 mounts the solar cell wafer 230 on the workpiece mounting surface 75 of the workpiece mounting tray 71. Consequently, the solar cell wafer 230 can be mounted on the workpiece mounting surface 75 without having the guide members 30 contact the rim parts of the solar cell wafer 230. After the solar cell wafer 230 is mounted by the Bernoulli chuck 20, the guide members 30 facing each other are forced to move towards each other along the inner surfaces of the guide holes 72 of the workpiece mounting tray 71 by the biasing force of the torsion spring 34 as the Bernoulli chuck 20 separates from the workpiece mounting surface 75 of the workpiece mounting tray 71. The guide members 30 then return to the steady positions thereof.

Moreover, when conveying each solar cell wafer 230, the electronic control device 130 drives the electric motor 121 to rotate the pivot (i.e., the non-contact holding device 1) based on the obtained orientation of each solar cell wafer 230, and aligns the orientation of each solar cell wafer 230 with the corresponding workpiece mounting surface 75 of the workpiece mounting tray 71. As a result of repeating these operations in real time, the solar cell wafers 230 that are mounted on the workpiece mounting tray 70 flowing on the first conveyor 200 are aligned and accommodated in the workpiece mounting tray 71 flowing on the second conveyor 201. When removing the solar cell wafers 230 from the workpiece mounting tray 70 or when mounting the solar cell wafers 230 on the workpiece mounting tray 71, the relative position between the non-contact holding device 1 and each of the workpiece mounting trays 70, 71 becomes slightly shifted due to the hand position accuracy of the parallel mechanism robot 100, the positional accuracies of the first and second conveyors 200 and 201, the detection position accuracy of the imaging device 220, and vibrations of various parts of the device. According to the present embodiment, such shifting can be absorbed by expanding the guide members 30, whereby the solar cell wafers 230 can be removed or mounted without having the guide members 30 contact the rim parts of each solar cell wafer 230.

According to the present embodiment, the eight guide members 30 disposed around the Bernoulli chuck 20 move away from each other along the guide holes 72 of the workpiece mounting tray 70, 71 as the Bernoulli chuck 20 approaches the workpiece mounting surfaces 75 of the workpiece mounting tray 70, 71. Therefore, when removing or mounting the workpiece 80, each of the eight guide members 30 is expanded to the outside of the rim parts of the workpiece 80. As a result, the guide members 30 can be prevented from coming into contact with the rim parts of the workpiece 80 when the workpiece 80 is removed from the workpiece mounting tray 70 or mounted on the workpiece mounting tray 71. This can consequently prevent deterioration of the performance caused as a result of damage to the edges of the workpiece such as the solar cell wafer when, for example, removing or mounting the workpiece.

According to the present embodiment, the eight guide members 30 are disposed facing each other with the Bernoulli chuck 20 therebetween. Therefore, the workpiece 80 held by the Bernoulli chuck 20 can be effectively prevented from shifting laterally when being conveyed.

According to the present embodiment, the eight guide members 30, which are expanded when the workpiece 80 is removed, are forced to move towards each other by the biasing force of the torsion spring 34 as the Bernoulli chuck 20 separates from each workpiece mounting surface 75 of the workpiece mounting tray 70. Then, the guide members 30 are moved to the positions where the guide members 30 come into substantially abutment with the rim parts of the workpiece 80. Therefore, a lateral movement of the workpiece 80 can be restricted appropriately when the held workpiece 80 is conveyed.

According to the present embodiment, each of the guide members 30 is configured by the tubular base end part 30a and the conic tip end part 30b extending from the base end part 30a. With this configuration, the area of contact between each rim part of the workpiece 80 and the each guide member 30 can be reduced when conveying the workpiece 80. Also, the guide members 80 can be moved more smoothly when being guided to the guide holes 72 formed on each workpiece mounting tray 70, 71.

According to the present embodiment, the more the eight guide members 30 are forced to move away from each other by the spring force of the torsion spring 34, the stronger the biasing force applied to each guide member 30 to bring the guide members 30 close to each other. The movable mechanism can be reduced in size and weight by using the torsion spring 34.

According to the present embodiment, the high-pressure air ejected from the Bernoulli chuck 20 is discharged, from the gap between the Bernoulli chuck 20 and the workpiece 80, generating the Bernoulli effect. As a result, suction force is generated. With the suction force, the workpiece 80 can be held in a non-contact manner.

The parallel mechanism robot 100 does not have an actuator in its movable part and therefore can keep the weight thereof low and can be driven at high speeds with a high degree of accuracy. Therefore, the base member 10 to which the Bernoulli chuck 20 and the guide members 30 are attached can be moved at extremely high speeds. Consequently, the use of the parallel mechanism robot 100 as the moving mechanism can transfer the workpiece 80 at high speeds while preventing the workpiece 80 from shifting laterally.

According to the workpiece trays 70, 71 of the present embodiment, by guiding the eight guide members 30 disposed around the Bernoulli chuck 20 along the guide holes 72, the eight guide members 30 can be moved away from each other as the Bernoulli chuck 20 approaches each workpiece mounting surface 75. Therefore, when removing or mounting the workpiece 80, the eight guide members 30 can be expanded to the outside of the rim parts of the workpiece 80.

Second Embodiment

Figure 10:
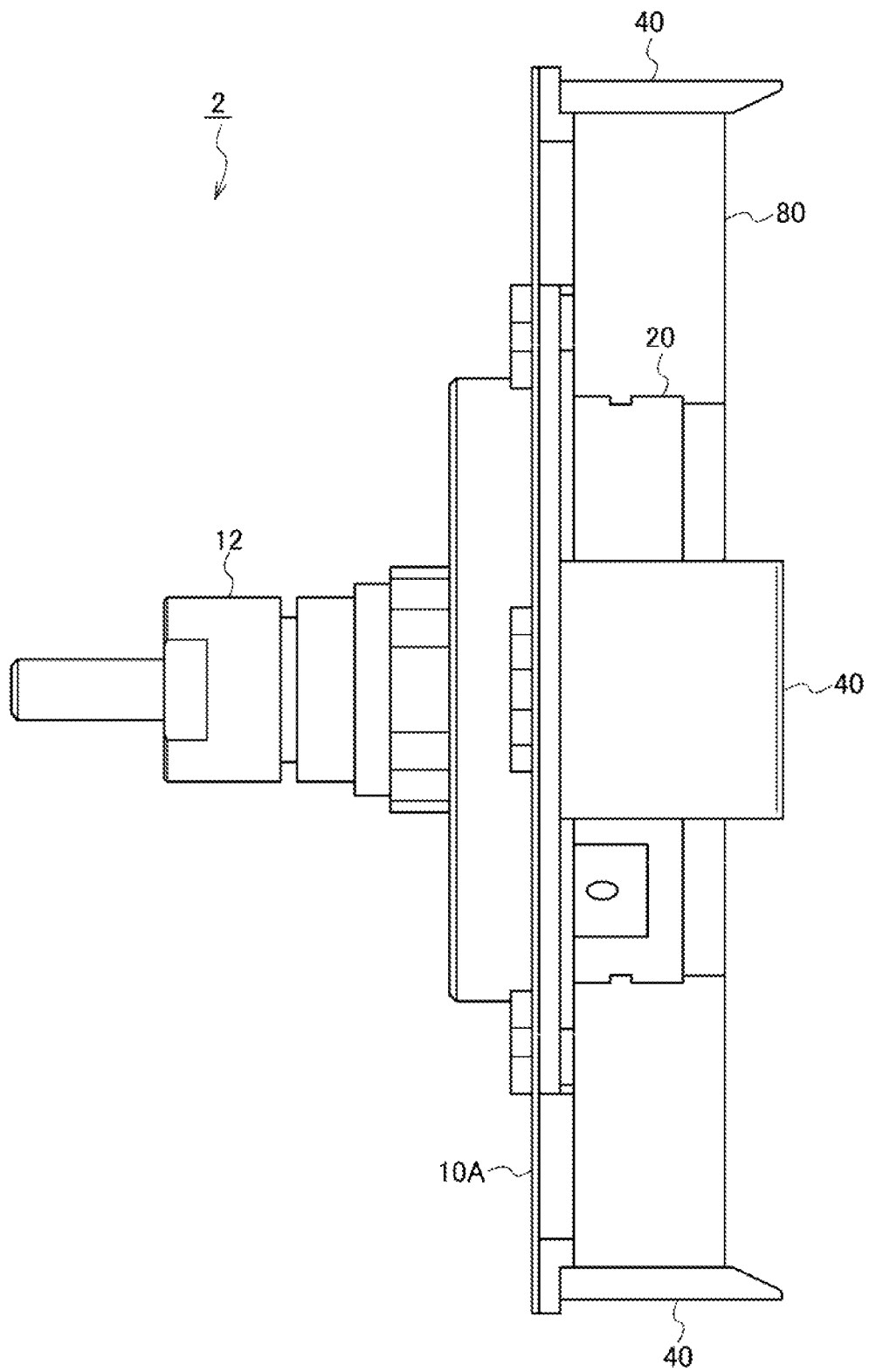
FIG. 10 is a side view showing a configuration of a non-contact holding device according to a second embodiment.
Figure 11:
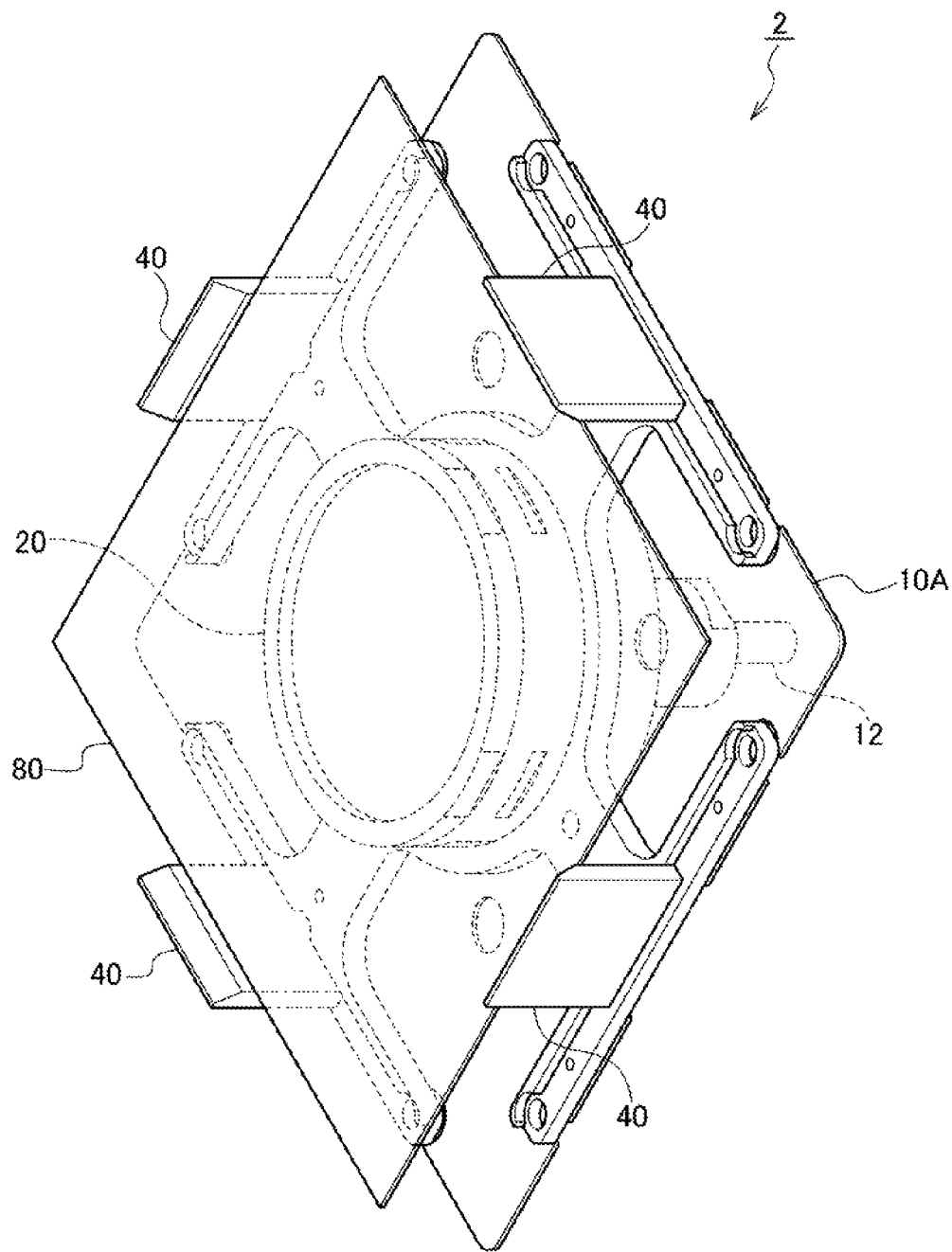
FIG. 11 is a perspective view showing a bottom surface of the non-contact holding device according to the second embodiment.

The pin-like guide members 30 are used in the non-contact holding device 1 illustrated above; however, plate-like guide members can be used in place of the pin-like guide members 30. A configuration of a non-contact holding device 2 according to the second embodiment is described next with reference to FIGS. 10 and 11. FIG. 10 is a side view showing the configuration of the non-contact holding device 2. FIG. 11 is a perspective view showing a bottom surface of the non-contact holding device 2 holding the workpiece 80. Note that reference numerals same as or similar to those used in the first embodiment are used to indicate the same elements in FIGS. 10 and 11.

The non-contact holding device 2 is different from the non-contact holding device 1 in having plate-like elastic guide members 40 in place of the pin-like guide members 30. The non-contact holding device 2 is also different from the non-contact holding device 1 in not having the movable mechanism shown in FIG. 4. The rest of the configuration of the non-contact holding device 2 is the same as that of the non-contact holding device 1; thus, the explanation thereof is omitted. Not only the configuration of the non-contact holding device 2, but also a configuration of a parallel mechanism robot is described herein is the same as that of the parallel mechanism robot 100 of the first embodiment; thus, the explanation thereof is omitted.

A lower surface of a chuck base 10A is provided with a plurality of plate-like guide members 40 (four, in the present embodiment) protruding vertically with respect to the lower surface of the chuck base 10A. These four guide members 40 are disposed at intervals around the Bernoulli chuck 20 so as to surround the workpiece 80 when the workpiece 80 is conveyed. More specifically, the guide members 40 are disposed on the sides of the chuck base 10A, such that the guide members 40 face each other with the Bernoulli chuck 20 therebetween. In a steady state, the guide members are disposed so as to substantially abut with the held workpiece 80, i.e., so as to obtain a clearance of approximately 0.1 to 0.2 mm between each guide member 40 and each of the sides of the workpiece 80. It is preferred that the arrangement of the guide members 40 be set according to the shape and the like of the workpiece 80.

The height of each guide member 40 is set to be longer than the size in the height direction of the Bernoulli chuck 20. The tip end of each guide member 40 projects downward below the workpiece holding surface of the Bernoulli chuck 20. The inner side of the tip end part of each guide member 40 is beveled. For this reason, the tip end parts of the guide members 40 can smoothly come into contact with the inner surfaces of the guide holes 72. Each guide member 40 has a constant width (e.g. approximately 35 mm) along each outer rim of the workpiece 80. The guide members are formed of an elastic body, such as fluororubber, urethane rubber, and silicon rubber. The surface of each guide member 40 may be coated with, for example, DLC (diamond-like carbon) in order to have a smooth surface with improved abrasion resistance.

With elasticity thereof, the lower end parts of the guide members 40 facing each other are configured to be able to deform (move) in a direction in which the guide members 40 separate from each other. Therefore, when removing the workpiece 80 from the workpiece mounting tray 70 on which the workpiece is disposed on the removal side or when mounting the held workpiece 80 on the workpiece mounting tray 71 on the mounting side, the guide members 40 facing each other are deformed such that the lower end parts of the guide members 40 bend and separate from each other along the guide holes 72 formed on the workpiece mounting tray 70, 71, as a non-contact holding device 2 (the Bernoulli chuck 20) approaches the workpiece mounting surface 75 of the workpiece mounting tray 70, 71.

At this moment, the more the guide members 40 facing each other deform so as to separate from each other, the stronger the restoring force (biasing force) acts to bring the guide members 40 close to each other. Thus, after the workpiece 80 is removed from the workpiece mounting tray 70 or the workpiece 80 is mounted on the workpiece mounting tray 71, the guide members 40 facing each other are forced to move towards each other by their own restoring force (biasing forces) along the guide holes 72 of the workpiece mounting tray 70, 71 as the Bernoulli chuck 20 separates from the workpiece mounting surface of the workpiece mounting tray 70, 71. The guide members 40 then return to the steady positions thereof. In other words, each guide member 40 functions as the biasing member described in the patent claims.

Figure 12:
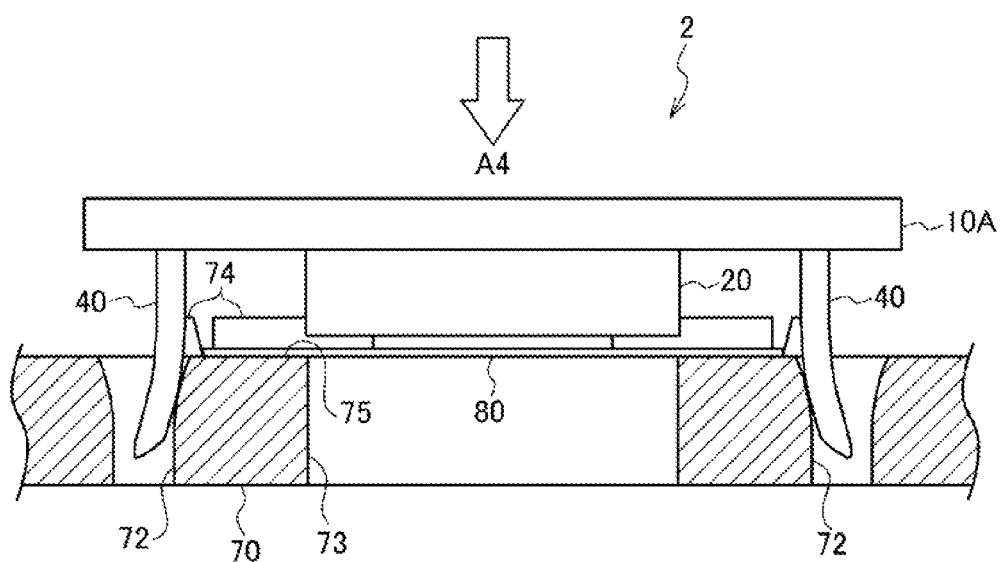
FIG. 12 is a diagram for explaining a movement of each of guide members of the non-contact holding device according to the second embodiment.

Here is described, with reference to FIG. 12, how each guide member 40 operates when the workpiece 80 is removed by the Bernoulli chuck 20. FIG. 12 is a diagram for explaining the movement of each of guide member 40 of the non-contact holding device 2. First, the Bernoulli chuck 20 descends perpendicularly to approach the workpiece mounting surface 75 of the workpiece mounting tray 70. Thereafter, the guide members 40 come into contact with the inner surfaces of the guide holes 72. The lower end parts of the guide members 40 gradually deform so as to separate from each other along the inclination parts 72a of the guide holes 72 as the Bernoulli chuck descends to approach the workpiece mounting surface 75.

Then, as shown in FIG. 12, while the lower end parts of the guide members are deformed to be bent by the guide holes 72, the Bernoulli chuck 20 holds the workpiece 80 in a non-contact manner. Consequently, the workpiece 80 can be held and removed without having the guide members 40 contact the rim parts of the workpiece 80. After the workpiece 80 is removed by the Bernoulli chuck 20, the guide members 40 facing each other use their own restoring forces (biasing forces) to move towards each other along the inner surfaces of the guide holes 72 of the workpiece mounting tray 70 as the Bernoulli chuck 20 ascends perpendicularly to separate from the workpiece mounting surface 75 of the workpiece mounting tray 70. As a result, the guide members 40 return to the steady positions thereof. In this manner, the workpiece 80 is prevented from shifting laterally when being conveyed.

According to the present embodiment, each of the guide member 40 is formed from a plate-like elastic body. Therefore, when removing or mounting the workpiece 80, each of the four guide members 40 can be moved to the outside of each rim part of the workpiece 80 by means of the elasticity of the elastic body. In addition, the more the four guide members 40 deform so as to separate from each other, the stronger the biasing force acts on each of the guide members 40 to bring the guide members 40 close to each other by using the restoring force of each elastic body.

According to the present embodiment, each guide member 40 is in the shape of a plate having a constant width in the direction of each outer rim of the held workpiece 80. Therefore, the guide members 40 can be deformed and spread easily. Furthermore, the lateral movement of the workpiece 80 can be stably restricted when conveying the workpiece 80.

The movable mechanism shown in FIG. 4 can be eliminated in the present embodiment, so that the structure can be simplified, thus achieving further reduction of the size, weight, and costs.

In both the first embodiment and the second embodiment, the contact between the guide members 30, 40 and the guide holes 72 occurs in the section below the workpiece 80. Therefore, even when abrasion powder is generated due to friction therebetween, the abrasion powder can be inhibited from contaminating the workpiece 80 as long as the abrasion powder halls down. Moreover, the safety of the sliding part of each of the guide members 30, 40 is protected from the abrasion powder because the sliding parts do not come into directly contact with the workpiece 80. When the workpiece mounting device is used in a clean room, and even when the abrasion powder is generated and flows in the room, the section of the workpiece 80 above the sliding positions can be prevented from getting contaminated, because clean air flows downward.

The above has described embodiments of the present invention. However, the present invention is not limited to these embodiments, and various modifications can be made to the present invention. For instance, the shape, size, number, and arrangement of the guide members 30, 40, the shape, size, and material of the base members 10, 10A, and the size, number, and arrangement of the Bernoulli chuck 20 are not particularly limited to those described in the embodiments and can be set according to the shape, size, and weight of the workpiece 80 to be held. For example, when mounting a circular workpiece in place of a square workpiece, the guide members are not necessarily disposed so as to face each other. For example, three guide members may be disposed at every 120° around the circular workpiece. In this case, the guide holes of the workpiece mounting tray are formed depending on the arrangement of the guide members.

In the first embodiment, the two pin-like guide members 30 enter one rectangular guide hole 72; however, the guide hole 72 may be divided into two circular or oval guide holes, and one pin-like guide member may be allowed to enter each of these guide holes.

Further, in the embodiments described above, the tray (workpiece mounting tray 70, 71) for accommodating a single workpiece 80 in a horizontal manner is used as the workpiece mounting device for mounting the workpiece 80 thereon; however, a cassette for accommodating a stack of a plurality of workpieces 80 may be used in place of the tray.

Each of the embodiments above has described an example in which the parallel mechanism robot 100 is applied to the step of palletizing the solar cell wafers 230; however, the scope of application of the parallel, mechanism robot 100 is not limited to the step of palletizing the solar cell wafers 230.

REFERENCE SIGNS LIST 1, 2 Non-contact holding device
10, 10A Chuck base
20 Bernoulli chuck
21 Main body
22 Concave part
23 Ejection hole
30, 40 Guide member
70, 71 Workpiece mounting tray
72 Guide hole
80 Workpiece
100 Parallel mechanism robot

The invention claimed is:
1. A transfer device, comprising:
a non-contact holding unit that holds a workpiece in a non-contact manner;
a base member to which the non-contact holding unit is attached;
a plurality of guide members that are disposed at intervals around the non-contact holding unit so as to surround the workpiece when the workpiece is conveyed and that are provided on the base member in a protruding manner; and
a moving mechanism that moves the base member within a space, wherein
the plurality of guide members are configured such that at least parts of the plurality of guide members can move away from each other, and wherein
when the workpiece is removed from a workpiece mounting device on which the workpiece is mounted or when the workpiece held by the non-contact holding unit is mounted on the workpiece mounting device, at least parts of the plurality of guide members come into contact with a guide part of the workpiece mounting device, at sections below a workpiece mounting surface of the workpiece mounting device and move away from each other along a guide part, as the non-contact holding unit approaches a workpiece mounting surface of the workpiece mounting device; wherein
a guide part is formed below a workpiece mounting surface of the workpiece mounting device; and wherein
at least parts of the plurality of guide members move away from each other by contact with a guide part;
a biasing member that applies biasing force to each of the guide members so as to bring the plurality of guide members close to each other as the plurality of guide members separate from each other, wherein
the plurality of guide members are moved towards each other by the biasing force of the biasing member, along the guide part formed on the workpiece mounting device, as the non-contact holding unit separates from the workpiece mounting surface of the workpiece mounting device.

2. The transfer device according to claim 1, wherein the plurality of guide members are disposed facing each other with the non-contact holding unit therebetween.

3. The transfer device according to claim 2, further comprising:
a biasing member that applies biasing force to each of the guide members so as to bring the plurality of guide members close to each other as the plurality of guide members separate from each other, wherein
the plurality of guide members are moved towards each other by the biasing force of the biasing member, along a guide part formed on the workpiece mounting device, as the non-contact holding unit separates from a workpiece mounting surface of the workpiece mounting device.

4. The transfer device according to claim 2, wherein each of the plurality of guide members includes a tubular base end part and a conic tip end part extending from the base end part.

5. The transfer device according to claim 2, wherein each of the plurality of guide members is formed from an elastic body.

6. The transfer device according to claim 2, wherein the non-contact holding unit is a Bernoulli chuck.

7. The transfer device according to claim 2, wherein the moving mechanism is a parallel mechanism robot that moves the base member while keeping the base member horizontal by means of a plurality of links.

8. The transfer device according to claim 1, wherein each of the plurality of guide members includes a tubular base end part and a conic tip end part extending from the base end part.

9. The transfer device according to claim 1, wherein the biasing member is a torsion spring.

10. The transfer device according to claim 1, wherein each of the plurality of guide members is formed from an elastic body.

11. The transfer device according to claim 10, wherein each of the plurality of guide members is a plate member that has a constant width in a direction along an outer rim of the workpiece to be held by the non-contact holding device.

12. The transfer device according to claim 1, wherein the non-contact holding unit is a Bernoulli chuck.

13. The transfer device according to claim 1, wherein the moving mechanism is a parallel mechanism robot that moves the base member while keeping the base member horizontal by means of a plurality of links.

14. A workpiece mounting device used along with the transfer device according to claim 1,
the workpiece mounting device comprising:
a guide part that guides each of the plurality of guide members such that the guide members move away from each other as the non-contact holding unit configuring the transfer device approaches the workpiece mounting surface.

15. The transfer device according to claim 1, wherein each of the plurality of guide members includes a tubular base end part and a conic tip end part extending from the base end part.

16. The transfer device according to claim 1, wherein each of the plurality of guide members is formed from an elastic body.

17. The transfer device according to claim 1, wherein the non-contact holding unit is a Bernoulli chuck.

18. The transfer device according to claim 1, wherein the moving mechanism is a parallel mechanism robot that moves the base member while keeping the base member horizontal by means of a plurality of links.

19. A workpiece mounting device used along with the transfer device according to claim 1,
the workpiece mounting device comprising:
a guide part that guides each of the plurality of guide members such that the guide members move away from each other as the non-contact holding unit configuring the transfer device approaches the workpiece mounting surface.

* * * * *